United States Patent
Ma

(10) Patent No.: US 7,274,585 B2
(45) Date of Patent: Sep. 25, 2007

(54) METHODS OF OPERATING INTEGRATED CIRCUIT MEMORY DEVICES

(75) Inventor: Sung-Hun Ma, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/321,610

(22) Filed: Dec. 29, 2005

(65) Prior Publication Data

US 2006/0149912 A1 Jul. 6, 2006

(30) Foreign Application Priority Data

Jan. 4, 2005 (KR) ...................... 10-2005-0000560

(51) Int. Cl.
*G11C 17/00* (2006.01)
(52) U.S. Cl. .................. 365/100; 365/230.01
(58) Field of Classification Search ................ 365/100, 365/230.01
See application file for complete search history.

(56) References Cited

U.S. PATENT DOCUMENTS

| | | | |
|---|---|---|---|
| 5,995,438 A * | 11/1999 | Jeng et al. ............. | 365/230.03 |
| 6,381,192 B1 * | 4/2002 | Ahn et al. ............. | 365/230.08 |
| 6,654,289 B2 | 11/2003 | Roohparvar | |
| 7,085,866 B1 * | 8/2006 | Hobson et al. ............. | 710/117 |
| 7,106,648 B2 * | 9/2006 | You ...................... | 365/230.06 |
| 7,117,332 B2 * | 10/2006 | Lin et al. .................... | 711/168 |
| 2006/0265533 A1* | 11/2006 | Hobson et al. ............. | 710/120 |

FOREIGN PATENT DOCUMENTS

| | | |
|---|---|---|
| JP | 2001-84772 A | 3/2001 |
| KR | 1998-073525 A | 11/1998 |

\* cited by examiner

*Primary Examiner*—Micheal Tran
(74) *Attorney, Agent, or Firm*—Myers Bigel Sibley & Sajovec PA

(57) ABSTRACT

Methods of operating an integrated circuit memory device include providing a first address and a first command to the memory device and executing the first command within the memory device. This step of executing the first command is performed concurrently with providing at least one of a second address and a second command to the memory device prior to terminating execution of the first command. This providing of at least one of the second address and the second command prior to termination execution of the first command improves timing efficiency by reducing delay associated with execution of each new command.

5 Claims, 1 Drawing Sheet

METHODS OF OPERATING INTEGRATED CIRCUIT MEMORY DEVICES

REFERENCE TO PRIORITY APPLICATION

This application claims priority to Korean Patent Application No. 2005-00560, filed Jan. 4, 2005, the disclosure of which is hereby incorporated herein by reference.

FIELD OF THE INVENTION

The present invention relates to integrated circuit devices and, more particularly, to integrated circuit memory devices and methods of operating integrated circuit memory devices.

BACKGROUND OF THE INVENTION

Integrated circuit memory devices are typically classified into one of two categories. These categories include random access memory (RAM) devices and read only memory (ROM) devices. Random access memory devices are typically volatile memory devices that lose their data when power to the memory is interrupted. In contrast, read only memory devices are typically non-volatile memory devices that retain their data even in the presence of power interruption. Examples of random access memory devices include dynamic RAM (DRAM) and static RAM (SRAM). Examples of non-volatile memory devices include programmable ROM (PROM), erasable programmable ROM (EPROM) and electrically erasable programmable ROM (EEPROM). A widely used EEPROM device includes flash memory, which may be classified as NAND-type or NOR-type.

FIG. 1 illustrates timing of a sequence of three operations within a memory device. Each of these operations (OPERATION 1-3) may represent a read, write or erase operation, for example. In order to perform an operation, the memory device is provided with an address and a command in sequence. This address and command may be provided by a host processor, which is electrically connected by a bus and other control lines to the memory device. Upon receipt of a command, the memory device executes corresponding operations. In the timing sequence of FIG. 1, a first address (ADD1) and a first command (CMD1) are received in sequence by the memory device. In response, the memory device executes corresponding first operations (EXE1). If the first command is a read command, the memory device may perform a read access to an internal memory array at a location defined by the first address and pass read data to an output port of the memory device. If the first command is a write command, the memory device may write new data into the internal memory array at a location defined by the first address. Finally, if the first command is an erase command, the designated first address (e.g., row address, page address, etc.) within the memory array may be erased. Once the operations associated with the first command have been fully executed, the sequence of receiving a new address and new command may be repeated. This is illustrated in FIG. 1 by the receipt of the second address (ADD2) after termination of the operations (EXE1) associated with the first command (CMD1) and the receipt of the third address (ADD3) after termination of operations associated with the second command (CMD2).

SUMMARY OF THE INVENTION

Embodiments of the present invention include methods of operating an integrated circuit memory device by providing a first address and a first command to the memory device and executing the first command within the memory device. This step of executing the first command is performed concurrently with providing at least one of a second address and a second command to the memory device prior to terminating execution of the first command. This providing of at least one of the second address and the second command prior to termination execution of the first command improves timing efficiency by reducing delay associated with execution of each new command. In some of these embodiments, the providing step may include sequentially providing the first address and then the first command to the memory device. Moreover, the executing step may include providing the second address to the memory device prior to terminating execution of the first command. In this case, the executing step may be followed by the step of providing the second command to the memory device after terminating execution of the first command. In alternative embodiments, the executing step includes providing the second command to the memory device prior to terminating execution of the first command. This executing step is followed by the step of providing the second address to the memory device after terminating execution of the first command.

Still further embodiments of the invention include methods of operating a flash memory device. These methods include providing a first address and a first read, write or erase command to the flash memory device. A step is then performed to execute the first read, write or erase command within the flash memory device concurrently with providing at least one of a second address and a second read, write or erase command to the flash memory device prior to terminating execution of the first read, write or erase command. Thereafter, a step is performed to execute the second read, write or erase command within the flash memory device concurrently with providing at least one of a third address and a third read, write or erase command to the flash memory device prior to terminating execution of the second read, write or erase command.

DETAILED DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
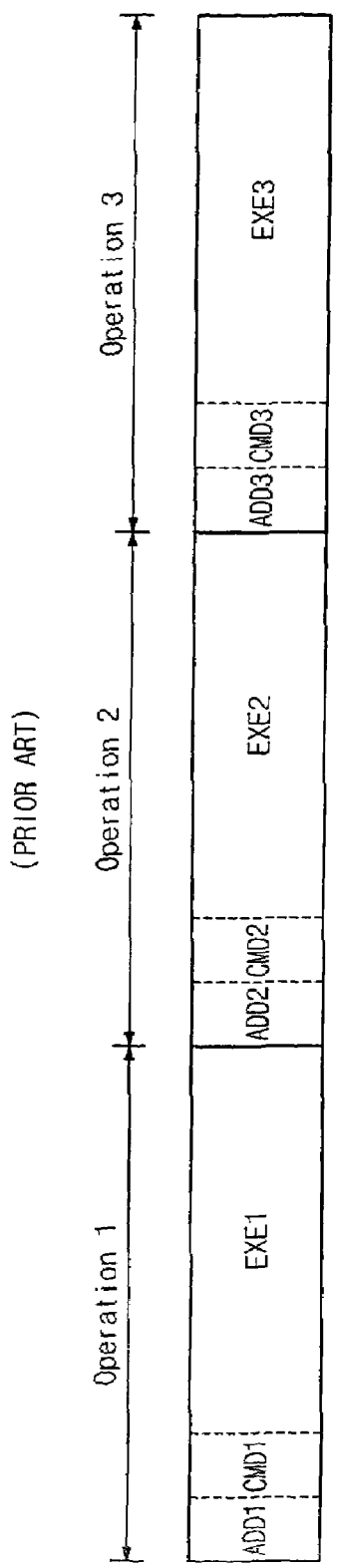
FIG. 1 is a diagram that illustrates timing of operations within a conventional memory device.
Figure 2:
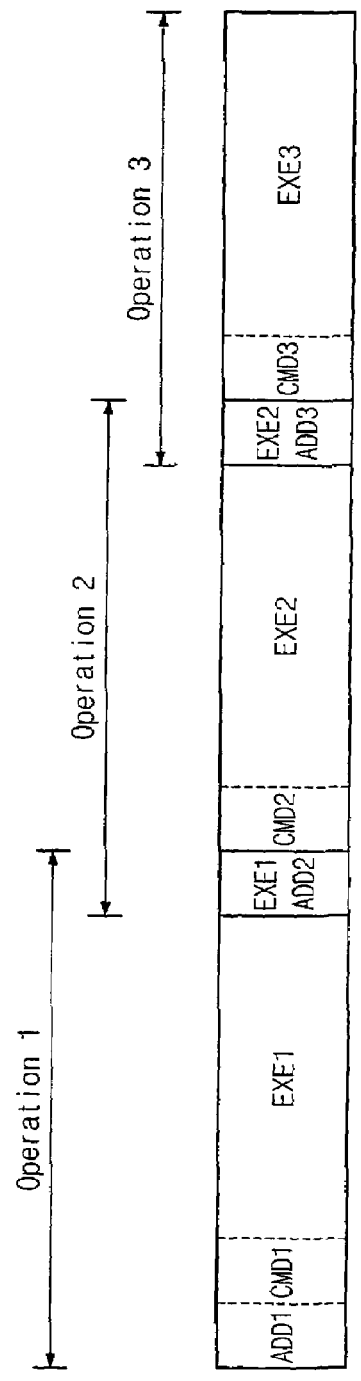
FIG. 2 is a diagram that illustrates timing of operations within a memory device according to embodiments of the present invention.

FIG. 2 illustrates timing of a sequence of three operations within a memory device according to embodiments of the present invention. Each of these operations (OPERATION 1-3) may represent a read, write or erase operation, for example. This memory device may be a flash memory device. In FIG. 2, the first, second and third operations are treated as read, write and erase operations, respectively. During the first operation, a first address ADD1 (i.e., read address) is loaded into an address register within the memory device and then a first command CMD1 (i.e., read command) is loaded into a command register within the memory device. These steps are then followed by the step of executing first operations (EXE1) (i.e., read operations) to carry out the read command. To improve timing efficiency, a second address ADD2 (i.e., write address) is loaded into an address register within the memory device prior to completion of the first operations. Thereafter, a second command CMD2 (i.e., write command) is loaded into a command register within the memory device. These steps are then followed by the step of executing second operations (EXE2) (i.e., write operations) to carry out the write command. To improve timing efficiency, a third address ADD3 (i.e., erase address) is loaded into an address register within the memory device prior to completion of the second operations. Thereafter, a third command CMD3 (i.e., erase command) is loaded into a command register within the memory device. These steps are then followed by the step of executing third operations (EXE3) (i.e., erase operations) to carry out the erase command. In alternative embodiments of the invention, the illustrated timing overlap between address loading and command execution may be replaced by a corresponding timing overlap between command loading and command execution. Thus, in FIG. 2, the timing overlap between the loading of the second address ADD2 and the terminal portion of operations associated with performing the read command may be replaced by an overlap between the loading of the second command CMD2 and the terminal portion of operations associated with performing the read command. Likewise, the timing overlap between the loading of the third address ADD3 and the terminal portion of operations associated with performing the write command may be replaced by an overlap between the loading of the third command CMD3 and the terminal portion of operations associated with performing the write command.

In the drawings and specification, there have been disclosed typical preferred embodiments of the invention and, although specific terms are employed, they are used in a generic and descriptive sense only and not for purposes of limitation, the scope of the invention being set forth in the following claims.

The invention claimed is:

1. A method of operating a flash memory device, comprising the steps of:
   providing a first address and a first read, write or erase command to the flash memory device;
   executing the first read, write or erase command within the flash memory device concurrently with providing at least one of a second address and a second read, write or erase command to the flash memory device prior to terminating execution of the first read, write or erase command; and
   executing the second read, write or erase command within the flash memory device concurrently with providing at least one of a third address and a third read, write or erase command to the flash memory device prior to terminating execution of the second read, write or erase command; wherein said step of executing the first read, write or erase command comprises providing the second address to the flash memory device prior to terminating execution of the first read, write or erase command.

2. The method of claim 1, wherein said providing step comprises sequentially providing the first address and then the first read, write or erase command to the flash memory device.

3. The method of claim 1, wherein said step of executing the first read, write or erase command is followed by the step of providing the second read, write or erase command to the flash memory device after terminating execution of the first read, write or erase command.

4. A method of operating a flash memory device; comprising the steps of: providing a first address and a first read, write or erase command to the flash memory device; executing the first read, write or erase command within the flash memory device concurrently with providing at least one of a second address and a second read, write or erase command to the flash memory device prior to terminating execution of the first read, write or erase command; and executing the second read, write or erase command within the flash memory device concurrently with providing at least one of a third address and a third read, write or erase command to the flash memory device prior to terminating execution of the second read, write or erase command;

The method of claim 2, wherein said step of executing the first read, write or erase command comprises providing the second read, write or erase command to the flash memory device prior to terminating execution of the first read, write or erase command.

5. The method of claim 4, wherein said step of executing the first read, write or erase command is followed by the step of providing the second address to the flash memory device after terminating execution of the first read, write or erase command.

* * * * *

UNITED STATES PATENT AND TRADEMARK OFFICE
CERTIFICATE OF CORRECTION

PATENT NO. : 7,274,585 B2  Page 1 of 1
APPLICATION NO. : 11/321610
DATED : September 25, 2007
INVENTOR(S) : Ma It is certified that error appears in the above-identified patent and that said Letters Patent is hereby corrected as shown below:

In The Claims:

Column 4, Claim 4 Line 27-39: Please correct to read:
-- 4. A method of operating a flash memory device, comprising the steps of:
providing a first address and a first read, write or erase command to the flash memory device;
executing the first read, write or erase command within the flash memory device concurrently with providing at least one of a second address and a second read, write or erase command to the flash memory device prior to terminating execution of the first read, write or erase command; and
executing the second read, write or erase command within the flash memory device concurrently with providing at least one of a third address and a third read, write or erase command to the flash memory device prior to terminating execution of the second read, write or erase command;
wherein said step of executing the first read, write or erase command comprises providing the second read, write or erase command to the flash memory device prior to terminating execution of the first read, write or erase command. --

Signed and Sealed this

Fourth Day of December, 2007

JON W. DUDAS
*Director of the United States Patent and Trademark Office*